(12) United States Patent
Chang et al.

(10) Patent No.: US 11,081,425 B2
(45) Date of Patent: Aug. 3, 2021

(54) SEMICONDUCTOR PACKAGES

(71) Applicant: SAMSUNG ELECTRONICS CO., LTD., Suwon-si (KR)

(72) Inventors: Gun-Ho Chang, Yongin-si (KR); Seung-Duk Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 16/505,040

(22) Filed: Jul. 8, 2019

(65) Prior Publication Data

US 2020/0144159 A1 May 7, 2020

(30) Foreign Application Priority Data

Nov. 6, 2018 (KR) .................. 10-2018-0135462

(51) Int. Cl.
*H01L 23/48* (2006.01)
*H01L 23/498* (2006.01)
(Continued)

(52) U.S. Cl.
CPC ...... *H01L 23/481* (2013.01); *H01L 23/49816* (2013.01); *H01L 23/5385* (2013.01); *H01L 27/10897* (2013.01)

(58) Field of Classification Search
CPC ........... H01L 23/49816; H01L 23/5385; H01L 27/10897; H01L 24/03; H01L 24/11; H01L 24/16; H01L 24/17; H01L 24/32; H01L 24/73; H01L 24/81; H01L 2224/16146; H01L 2224/81203; H01L 2224/97;
(Continued)

(56) References Cited

U.S. PATENT DOCUMENTS 7,576,433 B2   8/2009  Ishino et al.
8,513,802 B2   8/2013  Ma et al.
(Continued)

FOREIGN PATENT DOCUMENTS

EP         2 897 166 A1    7/2015
KR    10-2012-0057693 A    6/2012
(Continued)

OTHER PUBLICATIONS

Communication dated Jul. 21, 2020 issued by the European Patent Office in counterpart European Application No. 19 184 105.5.
(Continued)

*Primary Examiner* — Karen Kusumakar
*Assistant Examiner* — Adam S Bowen
(74) *Attorney, Agent, or Firm* — Sughrue Mion, PLLC

(57) ABSTRACT

A semiconductor package includes a base wafer including a first substrate and at least one first through via electrode extending through the first substrate, and a first semiconductor chip provided on the base wafer. The first semiconductor chip includes a second substrate; and at least one second through via electrode extending through the second substrate. The at least one second through via electrode is provided on the at least one first through via electrode to be electrically connected to the at least one first through via electrode. A first diameter of the at least one first through via electrode in a first direction is greater than a second diameter of the at least one second through via electrode in the first direction.

19 Claims, 9 Drawing Sheets

(51) Int. Cl.
*H01L 23/538* (2006.01)
*H01L 27/108* (2006.01)

(58) Field of Classification Search
CPC . H01L 2224/11002; H01L 2224/81005; H01L 2224/05569; H01L 2224/73104; H01L 2224/32145; H01L 2224/73204; H01L 2924/3511; H01L 2224/17181; H01L 2224/16145; H01L 24/05; H01L 24/13; H01L 2924/1432; H01L 2924/1431; H01L 2924/1434; H01L 2224/0401; H01L 2224/0557; H01L 25/50; H01L 2924/15311; H01L 2924/15192; H01L 25/18; H01L 2224/03002; H01L 2225/06513; H01L 2225/06517; H01L 2225/06541; H01L 2224/94; H01L 2224/06181; H01L 25/0652; H01L 23/5386; H01L 24/14; H01L 2224/111; H01L 2224/1411; H01L 2224/81101

See application file for complete search history.

(56) References Cited

U.S. PATENT DOCUMENTS

| | | | |
|---|---|---|---|
| 9,087,821 B2 | 7/2015 | Lin | |
| 9,343,432 B2 | 5/2016 | Lee et al. | |
| 9,859,191 B2 | 1/2018 | Lee et al. | |
| 2010/0164087 A1 | 7/2010 | Shibata | |
| 2012/0038045 A1 | 2/2012 | Lee | |
| 2013/0075895 A1 | 3/2013 | Miura et al. | |
| 2013/0193574 A1* | 8/2013 | Farooq | H01L 25/50 257/741 |
| 2014/0134798 A1* | 5/2014 | Kim | H01L 23/49827 438/109 |
| 2014/0159231 A1* | 6/2014 | Lundberg | H01L 23/291 257/737 |
| 2014/0327150 A1 | 11/2014 | Jung et al. | |
| 2015/0021785 A1 | 1/2015 | Lin | |
| 2015/0037914 A1 | 2/2015 | Takahashi et al. | |
| 2015/0162265 A1 | 6/2015 | Jo et al. | |
| 2016/0268182 A1* | 9/2016 | Lee | H01L 23/5384 |
| 2018/0247876 A1 | 8/2018 | Kim et al. | |

FOREIGN PATENT DOCUMENTS

| | | |
|---|---|---|
| KR | 10-2015-0066184 A | 6/2015 |
| KR | 10-1624972 B1 | 5/2016 |

OTHER PUBLICATIONS

Communication dated Dec. 2, 2019 issued by the European Patent Office in counterpart European Patent Application No. 19184105.5.

* cited by examiner

SEMICONDUCTOR PACKAGES

CROSS-REFERENCE TO RELATED APPLICATION

This application claims priority under 35 U.S.C. § 119 to Korean Patent Application No. 10-2018-0135462, filed on Nov. 6, 2018 in the Korean Intellectual Property Office, the disclosure of which is incorporated herein by reference in its entirety.

BACKGROUND

1. Field

Example embodiments relate to a semiconductor package, and more particularly, to a semiconductor package including a through via electrode.

2. Description of the Related Art

In a semiconductor package, a high bandwidth memory (HBM) may be stacked on a wafer by a chip-on-wafer (CoW) process. In addition, a through-silicon via (TSV), which is an electrical connection which passes through the wafer, may be formed on the wafer. As the size of the TSV and the thickness of the wafer become smaller while still being required to ensure a high speed and a high capacity, the wafer may be more prone to be damaged by warpage in subsequent processes after the CoW process.

SUMMARY

One of more example embodiments provide a semiconductor package having a high reliability.

According to an aspect of an example embodiment, there is provided a semiconductor package. The semiconductor package may include a base wafer including a first substrate and at least one first through via electrode extending through the first substrate, and a first semiconductor chip provided on the base wafer. The first semiconductor chip includes a second substrate; and at least one second through via electrode extending through the second substrate. The at least one second through via electrode is provided on the at least one first through via electrode to be electrically connected to the at least one first through via electrode. A first diameter of the at least one first through via electrode in a first direction is greater than a second diameter of the at least one second through via electrode in the first direction.

According to an aspect of another example embodiment, there is provided a semiconductor package. The semiconductor package may include a base wafer including a first substrate and a first through via electrode extending through the first substrate, and a semiconductor chip provided on the base wafer and including a second substrate and a second through via electrode extending through the second substrate. A first diameter of the first through via electrode in a first direction is different from a second diameter of the second through via electrode in the first direction. A first aspect ratio of the first through via electrode is equal to or greater than a second aspect ratio of the second through via electrode.

According to an aspect of another example embodiment, there is provided a semiconductor package. The semiconductor package may include a package substrate, an interposer provided on the package substrate, a base chip including a first substrate and at least one first through via electrode extending through the first substrate, a first semiconductor chip provided on the base chip and including a second substrate and at least one second through via electrode extending through the second substrate, and a processor chip provided on the interposer and spaced apart in a first direction from the base chip. The at least one second through via electrode is provided on the at least one first through via electrode to be electrically connected to the at least one through via electrode. A first diameter of the at least one first through via electrode in the first direction is greater than a second diameter of the at least one second through via electrode in the first direction.

BRIEF DESCRIPTION OF THE DRAWINGS

The above and/or other aspects will be more clearly understood from the following detailed description taken in conjunction with the accompanying drawings, in which.

DETAILED DESCRIPTION

Figure 1:
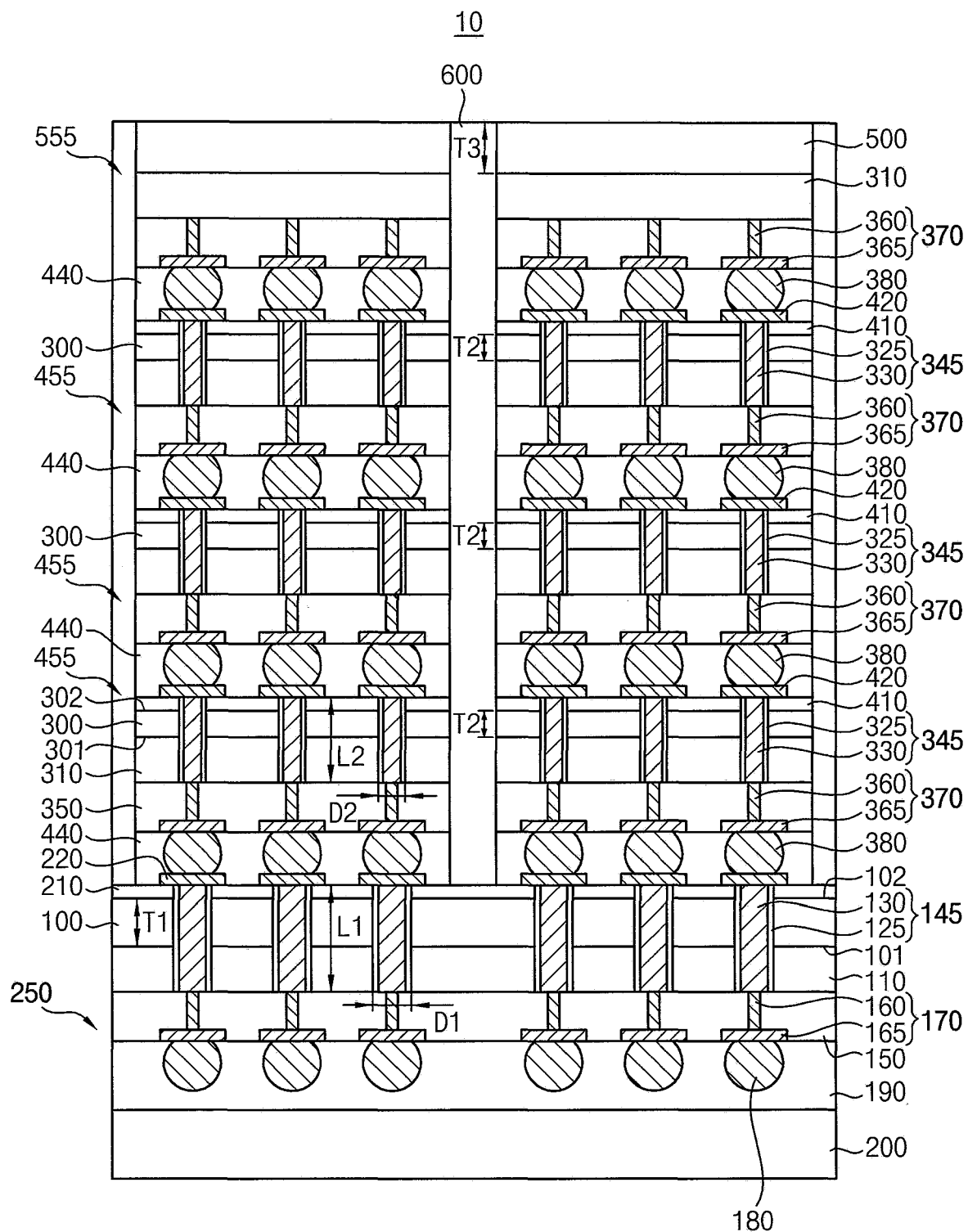
FIG. 1 is a cross-sectional view illustrating a semiconductor package in accordance with an example embodiment.

FIG. 1 is a cross-sectional view illustrating a semiconductor package 10 in accordance with an example embodiment.

Referring to FIG. 1, the semiconductor package 10 may include a plurality of first semiconductor chips 455 and a second semiconductor chip 555 sequentially stacked on a base wafer 250. Sidewalls of the plurality of first semiconductor chips 455 and the second semiconductor chip 555 may be covered by a molding element 600 on the base wafer 250.

The base wafer 250 may include a first insulating interlayer 110, a second insulating interlayer 150, and a first conductive bump 180 sequentially stacked on a lower surface (or a first surface 101) of a first substrate 100 downwardly. That is, referring to FIG. 1, the first insulating interlayer 110 is stacked under the lower surface 101 of the first substrate 100, the second insulating interlayer 150 is stacked under the first insulating interlayer 110 and the first conductive bump 180 is stacked under the second insulating interlayer 150. The base wafer 250 may further include a first through via electrode 145 extending through the first substrate 100 and the first insulating interlayer 110, a first wiring structure 170 disposed in the second insulating interlayer 150, a first passivation layer 210 provided on a top surface (or a second surface 102) of the first substrate 100 and also covering an upper sidewall of the first through via electrode 145, and a first conductive pad 220 provided on the first passivation layer 210 and contacting an upper surface of the first through via electrode 145.

The first substrate 100 may include silicon (Si), germanium (Ge), silicon-germanium (SiGe), or category III-V compounds, e.g., gallium phosphide (GaP), gallium arsenide (GaAs), gallium antimonide (GaSb), etc. In some example embodiments, the first substrate 100 may be a silicon-on-insulator (SOI) substrate, or a germanium-on-insulator (GeOI) substrate.

The first substrate 100 may have a first surface (e.g., the bottom surface) 101 and a second surface (e.g., the top surface) 102 opposite to the first surface 101, and a distance between the first and second surfaces 101 and 102, that is, a thickness of the first substrate 100 in a vertical direction substantially perpendicular to the first surface 101 may be a first thickness T1.

In an example embodiment, a circuit element may be formed under the first surface 101 of the first substrate 100, which may be covered by the first insulating interlayer 110. That is, a circuit element may be provided between the first substrate 100 and the first insulating interlayer 110. For example, a transistor as the circuit element may be formed between the first substrate 100 and the first insulating interlayer 110. The transistor may include a gate structure beneath the first surface 101 of the first substrate 100 and an impurity region at a lower portion of the first substrate 100 adjacent the gate structure. However, embodiments are not be limited thereto, and for example, diodes, resistors, inductors, capacitors, etc., may be formed as the circuit element between the first substrate 100 and the first insulating interlayer 110.

The first insulating interlayer 110 may include an oxide ($O^{2-}$), e.g., silicon oxide ($SiO_2$). A contact plug may be formed through the first insulating interlayer 110 to contact the impurity region and/or the gate structure described above. The contact plug may include a metal, a metal nitride, a metal silicide, etc.

The first through via electrode 145 may extend through both the first substrate 100 and the first insulating interlayer 110 to protrude out (upward as shown in FIG. 1) from the second surface 102 of the first substrate 100. In an example embodiment, the first through via electrode 145 may include a first conductive layer 130 and a first insulation pattern 125 provided on an external sidewall of the first conductive layer 130, and may further include a first barrier pattern provided between the first conductive layer 130 and the first insulation pattern 125.

The first insulation pattern 125 may include an oxide ($O^{2-}$), e.g., silicon oxide ($SiO_2$), the first conductive layer 130 may include a metal, e.g., tungsten (W), copper (Cu), aluminum (Al), etc., and the first barrier pattern may include a metal nitride, e.g., titanium nitride (TiN), tantalum nitride (TaN), etc.

In an example embodiment, the first through via electrode 145 may have a first diameter D1 in a horizontal direction (in FIG. 1; i.e., substantially parallel to the first surface 101 of the first substrate 100), and a first length L1 in the vertical direction (i.e., a direction substantially perpendicular to the first surface 101).

As an example embodiment, FIG. 1 shows six first through via electrodes 145 spaced apart from one another, however, example embodiments may not be limited thereto, and any number of plurality of first through via electrodes 145 may be formed in the semiconductor package 10.

The second insulating interlayer 150 may include, e.g., silicon oxide ($SiO_2$) doped with fluorine (F) or carbon (C), a porous $SiO_2$, spin on organic polymer, or an inorganic polymer, e.g., hydrogen silsesquioxane (HSSQ), methyl silsesquioxane (MSSQ), etc.

In an example embodiment, the first wiring structure 170 may include at least one first wiring 165 disposed in the second insulating interlayer 150 and at least one first via 160 connected to the first wirings 165 or connecting the first wiring 165 and the first through via electrode 145 to each other. FIG. 1 shows one first via 160 and one first wiring 165 sequentially stacked under a lower surface of the first through via electrode 145. Each of the first wiring 165 and the first via 160 may include a metal, a metal nitride, a metal silicide, etc.

The first conductive bump 180 may be formed under the second insulating interlayer 150 to contact a lower surface of the first wiring 165. The first conductive bump 180 may include a metal, e.g., silver (Ag), copper (Cu), etc., or an alloy, and may be formed as solder.

The first passivation layer 210 may be formed on the second surface (i.e., the top surface) 102 of the first substrate 100 and may cover an upper portion of the sidewall of the first through via electrode 145. The first passivation layer 210 may include an $O^{2-}$ and/or a nitride ($N^{-3}$). In an example embodiment, the first passivation layer 210 may include a plurality of distinct layers including a first oxide layer, a nitride layer, and a second oxide layer sequentially stacked.

The first conductive pad 220 may be formed on the first passivation layer 210 to contact the upper surface of the first through via electrode 145. The first conductive pad 220 may include a metal, a metal nitride, a metal silicide, etc.

In addition, a redistribution layer may be further formed between the first through via electrode 145 and the first conductive pad 220.

In an example embodiment, the base wafer 250 may include a logic device or a controller. Alternatively, the base wafer 250 may include a memory device, e.g., a dynamic random access memory (DRAM) device.

The structure of the first semiconductor chip 455 may be substantially the same as or similar to that of the base wafer 250, except for the first semiconductor chip 455 includes a second substrate 300 and a second through via electrode 345 instead of the first substrate 100 and the first through via electrode 145.

In more detail, the first semiconductor chip 455 may include a third insulating interlayer 310, a fourth insulating interlayer 350, and a second conductive bump 380 sequentially stacked under a lower surface of the second substrate 300 downwardly similar to the base wafer 250 described above. The first semiconductor chip 455 may further include, in addition to the second through via electrode 345 extending through the second substrate 300 and the third insulating interlayer 310 mentioned above, a second wiring structure 370 disposed in the fourth insulating interlayer 350, a second passivation layer 410 provided on the second substrate 300 and covering an upper portion of the sidewall of the second through via electrode 345, and a second conductive pad 420 provided on the second passivation layer 410 and contacting an upper surface of the second through via electrode 345.

The second substrate 300 may have a first surface (i.e., the lower surface) 301 and a second surface (i.e., the upper/top surface) 302 opposite to the first surface 301, and a distance between the first and second surfaces 301 and 302, that is, a thickness of the second substrate 300 in the vertical direction (i.e., in the direction perpendicular to the extending direction of the first and second surfaces 301 and 302) may be a second thickness T2. In an example embodiment, the second thickness T2 may be less than the first thickness T1.

In an example embodiment, a circuit element may be formed under the first surface 301 of the second substrate 300, which may be covered by the third insulating interlayer 310. That is, the circuit element may be formed between the second substrate 300 and the third insulating layer 310. In addition, a contact plug may be formed through the third insulating interlayer 310.

The first through via electrode 345 may extend through the second substrate 300 and the third insulating interlayer 310 to protrude out from the second surface (i.e., the top surface) 302 of the second substrate 300. In an example embodiment, the second through via electrode 345 may include a second conductive layer 330 and a second insulation pattern 325 provide on an exterior sidewall of the second conductive layer 330, and may further include a second barrier pattern between the second conductive layer 330 and the second insulation pattern 325.

The second through via electrode 345 may have a second diameter D2 in the horizontal direction and a second length L2 in the vertical direction. In an example embodiment, the second diameter D2 of the second through via electrode 345 may be less than the first diameter D1 of the first through via electrode 145, and the second length L2 of the second through via electrode 345 may be less than the first length L1 of the first through via electrode 145.

However, a ratio (e.g., a first aspect ratio) of the first length L1 with respect to the first diameter D1 may be substantially equal to or greater than a ratio (e.g., a second aspect ratio) of the second length L2 with respect to the second diameter D2.

In the example embodiment shown in FIG. 1, the semiconductor package 10 includes three second through via electrodes 345 spaced apart from one another, however, example embodiments may not be limited thereto, and any number of plurality of second through via electrodes 345 may be formed.

In an example embodiment, the second wiring structure 370 may include at least one second wiring 365 disposed in the fourth insulating interlayer 350 and at least one second via 360 connected to the second wirings 365 or connecting the second wiring 365 and the second through via electrode 345 to each other.

In an example embodiment, one or a plurality of first semiconductor chips 455 may be stacked in the vertical direction on the base wafer 250. FIG. 1 shows three first semiconductor chips 455 stacked on the base wafer 250, however, example embodiments may not be limited thereto. For example, the first semiconductor chips 455 may be stacked in seven levels.

In an example embodiment, the first semiconductor chip 455 may be a memory chip, e.g., a DRAM chip.

Additionally, a plurality of first semiconductor chips 455 may be spaced apart from one another in the horizontal direction.

The second semiconductor chip 555 may be stacked on an uppermost one of the stacked first semiconductor chips 455 or one of the first semiconductor chips 455. In an example embodiment, the second semiconductor chip 555 may not include any through via electrode unlike the first semiconductor chip 455, and a third substrate 500 in the second semiconductor chip 555 may have a third thickness T3 in the vertical direction. The third thickness T3 of the third substrate 500 may be greater than the second thickness T2 of the first semiconductor chip 455.

In an example embodiment, the second semiconductor chip 555 may be a memory chip, e.g., a DRAM chip.

In an example embodiment, a third adhesion layer 440 may be formed between the base wafer 250 and a lowermost one of the plurality of first semiconductor chips 455, between two adjacent of the first semiconductor chips 445 stacked in the vertical direction, and between the uppermost one of the plurality of first semiconductor chips 455 and the second semiconductor chip 555. The plurality of first semiconductor chips 455 and the second semiconductor chip 555 may be electrically connected to one another by the first and second conductive pads 220 and 420 and the second conductive bump 380.

In an example embodiment, the mold element 600 may include an epoxy molding compound (EMC).

In an example embodiment, in the semiconductor package 10, the first thickness T1 of the first substrate 100 in the base wafer 250 may be greater than the second thickness T2 of each of the plurality of first semiconductor chips 455 stacked on the first substrate 100, and thus damage to the semiconductor package 10 due to potential warpage may be reduced. Accordingly, the semiconductor package 10 may be manufactured with enhanced reliability and with less scrap and rework.

The second diameter D2 of the second through via electrode 345 disposed in each of the plurality of first semiconductor chips 455 may be less than the first diameter D1 of the first through via electrode 145 disposed in the base wafer 250, and thus the first semiconductor chips 455 may have an increased margin of error with respect to their positioning in the layout of the circuit patterns or wirings.

In addition, in the example embodiment, the second aspect ratio of the second through via electrode 345 may be substantially equal to or less than the first aspect ratio of the first through via electrode 145, and thus, even if the second through via electrode 345 has a relatively small diameter, the characteristics of the second through via electrode 345 may not be deteriorated by reducing its vertical length accordingly.

Further, the second thickness T2 of the second substrate 300 in each of the first semiconductor chips 455 may be less than the first thickness T1 of the first substrate 100 in the base wafer 250, and thus a greater number of first semiconductor chips 455 may be stacked on the base wafer 250 and the semiconductor package 10 may have increased capacity as well as enhanced performance.

FIGS. 2 to 9 are cross-sectional views illustrating a method of manufacturing the semiconductor package 10 of FIG. 1 in accordance with example embodiments.

Figure 2:
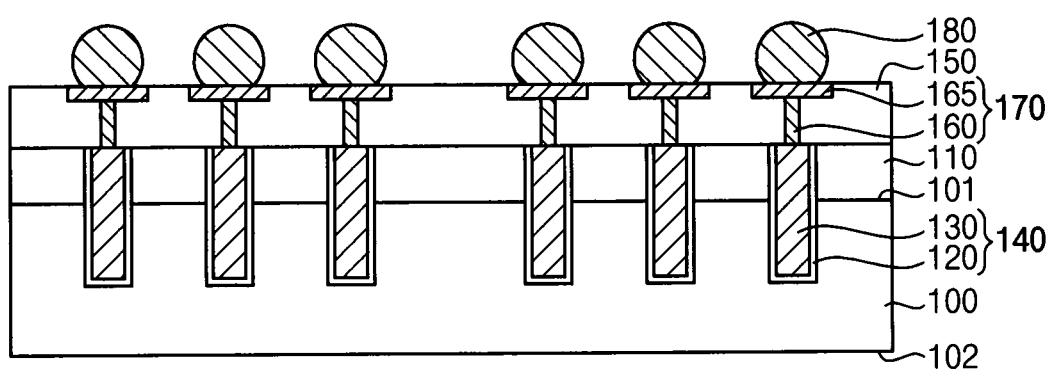
FIGS. 2 to 9 are cross-sectional views illustrating a method of manufacturing the semiconductor package of FIG. 1 in accordance with example embodiments.

Referring to FIG. 2, circuit elements may be formed on a first surface 101 (i.e., the bottom surface 101 shown in FIG. 1) of a first substrate 100, and a first insulating interlayer 110 may be formed on the first surface 101 of the first substrate 100 to cover/insulate the circuit elements.

For example, a transistor may be formed on the first surface 101 of the first substrate 100 as the circuit element. The transistor may include a gate structure on the first surface 101 of the first substrate 100 and an impurity region at an upper portion of the first substrate 100.

A contact plug may be formed through the first insulating interlayer 110 to contact the impurity region and/or the gate structure.

A first preliminary through via electrode 140 may be formed partially through the first substrate 100.

Particularly, the first insulating interlayer 110 and an upper portion of the first substrate 100 may be etched using a first etching mask to form a first trench, a first insulation layer 120 may be formed on an inner wall of the first trench, the first insulating interlayer 110 and the contact plug, a first conductive layer 130 may be formed on the first insulation layer 120 to fill the first trench. The first conductive layer 130 and the first insulation layer 120 may be planarized until an upper surface of the first insulating interlayer 110 is exposed to form the first preliminary through via electrode 140 including the first insulation layer 120 and the first conductive layer 130 and filling the first trench. The first preliminary through via electrode 140 may further include a first barrier layer between the first conductive layer 130 and the first insulation layer 120.

A second insulating interlayer 150 containing a first wiring structure 170 formed therein may be disposed on the first insulating interlayer 110, the contact plug and the first preliminary through via electrode 140.

In an example embodiment, the first wiring structure 170 may include at least one first wiring 165 and at least one first via 160 connected to the first wirings 165 or connecting the first wiring 165 and the first preliminary through via electrode 140 to each other. FIG. 2 shows one first via 160 and one first wiring 165 sequentially stacked on the first preliminary through via electrode 140. However, the example embodiment is not limited to a single first wiring 165 and a single first via 160.

In an example embodiment, the first wiring 165 and the first via 160 may be formed by a dual damascene process or a single damascene process.

A first conductive bump 180 may be formed on the second insulating interlayer 150 to contact an upper surface (or an exposed surface) of the first wiring 165.

Figure 3:
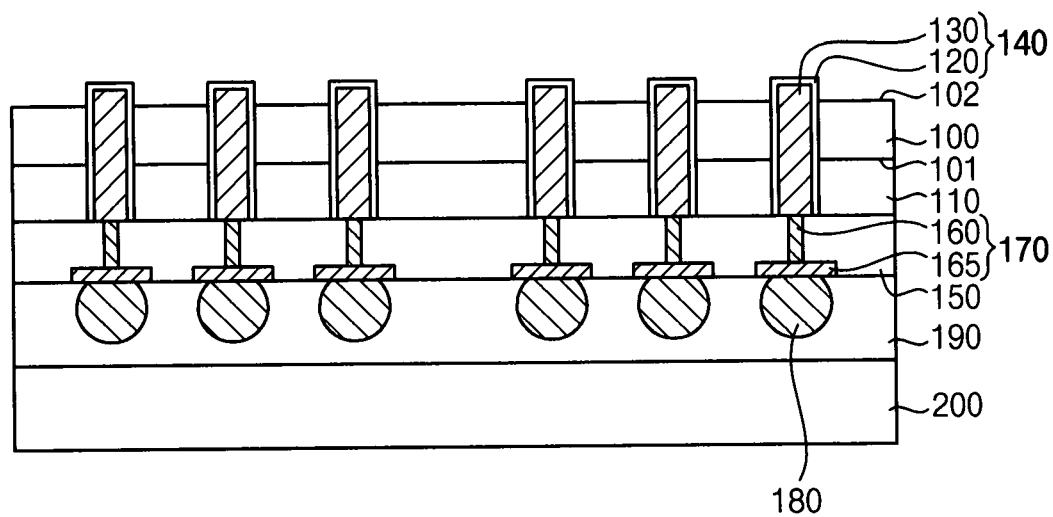

Referring to FIG. 3, a first adhesion layer 190 may be formed on the second insulating interlayer 150 and the first wiring 165 to cover the first conductive bump 180, and a first handling substrate 200 may be attached to the first adhesion layer 190.

The first adhesion layer 190 and the first handling substrate 200 may be sequentially stacked to form a wafer support system (WSS).

The first substrate 100 may be turned upside down using the WSS so that a second surface 102 of the first substrate 100 may face upwardly as shown in the figure, and a portion of the first substrate 100 adjacent the second surface 102 may be removed to expose an upper portion of the first preliminary through via electrode 140. The portion of the first substrate 100 may be removed by an etch back process and/or a grinding process.

Figure 4:
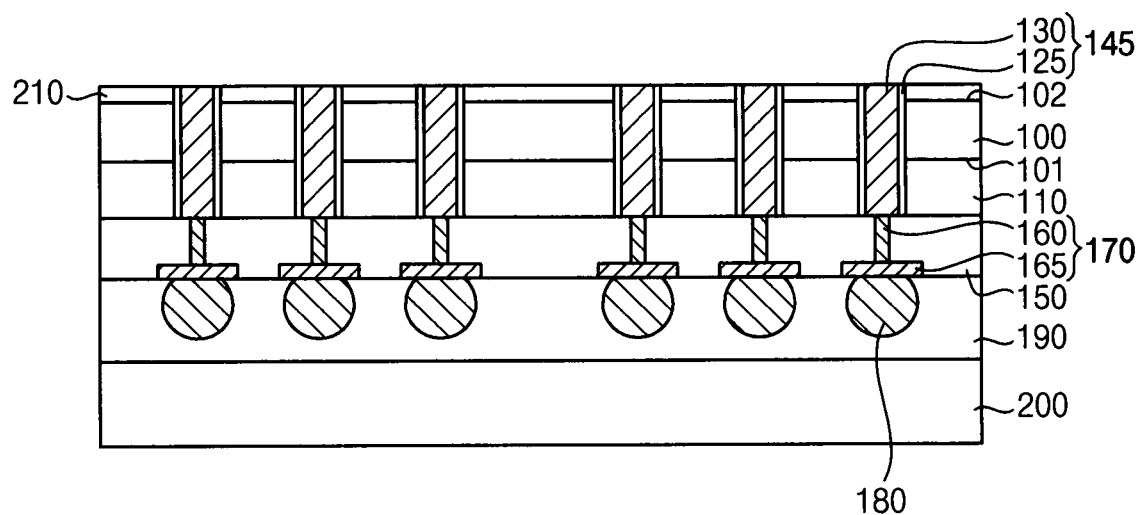

Referring to FIG. 4, a first passivation layer 210 may be formed on the second surface (i.e., the top surface) 102 of the first substrate 100 and the exposed portion of the first preliminary through via electrode 140 and an upper portion of the first passivation layer 210 may be planarized until an upper surface of the first conductive layer 130 of the first preliminary through via electrode 140 is exposed.

Thus, a portion of the first insulation layer 120 on the first conductive layer 130 of the first preliminary through via electrode 140 may be removed to form a first insulation pattern 125, and a first through via electrode 145 including the first conductive layer 130 and the first insulation pattern 125 on a sidewall of the first conductive layer 130 may be formed.

In an example embodiment, the planarization process may be performed by a chemical mechanical polishing (CMP) process and/or a etch back process.

In an example embodiment, the first passivation layer 210 may include a first oxide layer, a nitride layer and a second oxide layer sequentially stacked.

Figure 5:
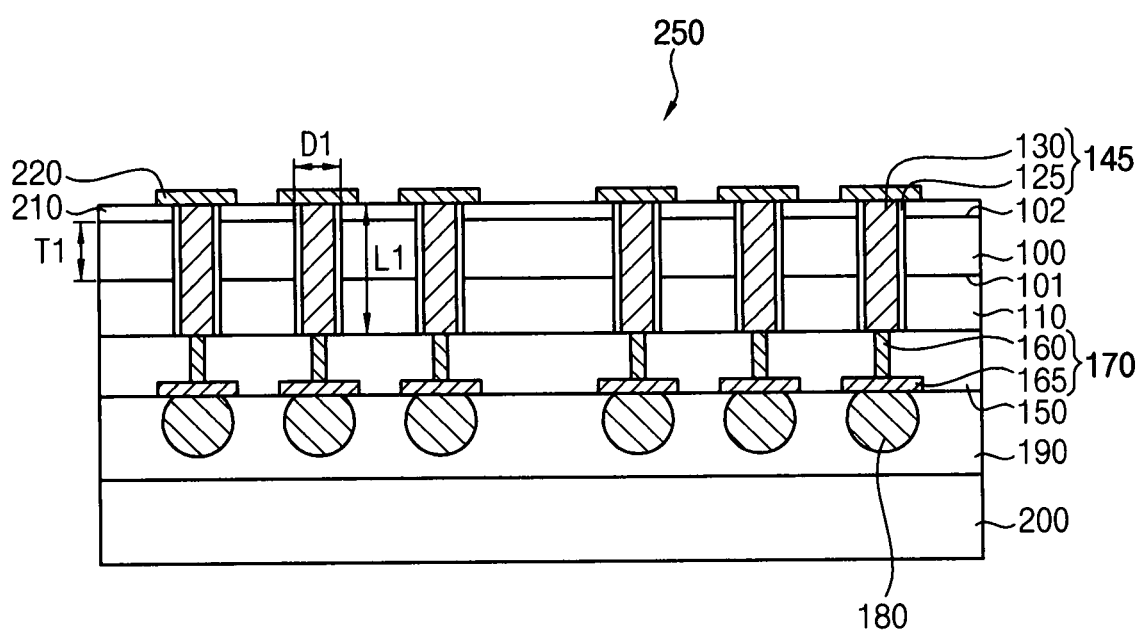

Referring to FIG. 5, a first conductive pad 220 may be formed on the first passivation layer 210 to contact an upper surface of the exposed first through via electrode 145.

A redistribution layer may be further formed between the first through via electrode 145 and the first conductive pad 220.

By the above processes, a base wafer 250 that may be supported by the WSS and may include the first through via electrode 145 may be formed.

In an example embodiment, the first through via electrode 145 may have a first diameter D1 in a horizontal direction substantially parallel to the first surface 101 of the first substrate 100, and have a first length L1 in a vertical direction substantially perpendicular to the first surface 101 of the first substrate 100. Additionally, the first substrate 100 in the base wafer 250 may have a first thickness T1 in the vertical direction.

Figure 6:
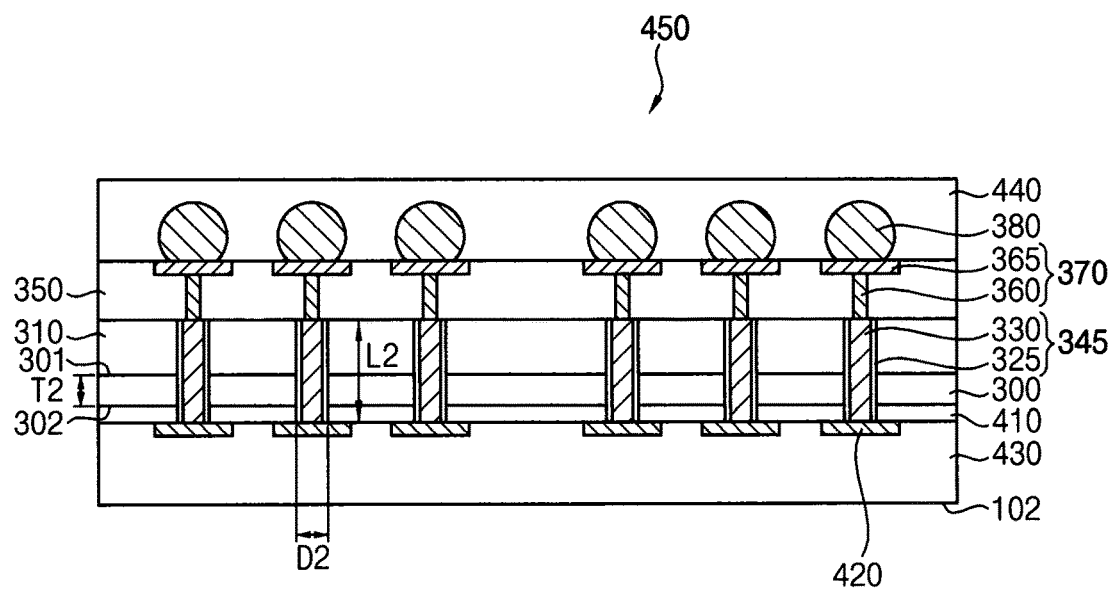

Referring to FIG. 6, processes substantially the same as or similar to those illustrated with reference to FIGS. 2 to 5 may be performed to form the first semiconductor chip 455.

That is, circuit elements may be formed on a first surface 301 of a second substrate 300, and a third insulating interlayer 310 may be formed on the first surface 301 of the second substrate 300 to cover the circuit elements. A contact plug may be formed through the third insulating interlayer 310 to contact an impurity region and/or a gate structure. A second preliminary through via electrode including a second insulation layer and a second conductive layer 330 may be formed partially through the second substrate 300.

A fourth insulating interlayer 350 containing a second wiring structure 270 therein may be formed on the third insulating interlayer 310, the contact plug and the second preliminary through via electrode. The second wiring structure 370 may include at least one second wiring 365 and at least one second via 360.

A second conductive bump 380 may be formed on the fourth insulating interlayer 350 to contact an upper surface of the second wiring 365. A second adhesion layer may be formed on the fourth insulating interlayer 350 and the second wiring 365 to cover the second conductive bump 380, and a second handling substrate may be attached to the second adhesion layer. The second substrate 300 may be turned upside down using the second handling substrate so that a second surface 302 of the second substrate 300 may face upwardly, and an upper portion of the second substrate 300 adjacent the second surface 302 may be removed to expose a portion of the second preliminary through via electrode.

A second passivation layer 410 may be formed on the second surface 302 of the second substrate 300 and the exposed portion of the second preliminary through via electrode, and an upper portion of the second passivation layer 410 may be planarized until an upper surface of the second conductive layer 330 of the second preliminary through via electrode may be exposed. Thus, a portion of the second insulation layer on the second conductive layer 330 of the second preliminary through via electrode may be removed to form a second insulation pattern 325, and a second through via electrode 345 including the second conductive layer 330 and the second insulation pattern 325 on a sidewall of the second conductive layer 330 may be formed. A second conductive pad 420 may be formed on the second passivation layer 410 to contact an upper surface of the second through via electrode 345.

A tape 430 may be formed on the second conductive pad 420 and the second passivation layer 410, the second substrate 300 may be turned over using the tape 430 so that the first surface 301 of the second substrate 300 may face upwardly, and the second adhesion layer and the second handling substrate may be removed to expose the second conductive bump 380 and the fourth insulating interlayer 350.

A third adhesion layer 440 may be formed on the exposed second conductive bump 380 and the fourth insulating interlayer 350.

By the above processes, a stack wafer 450 including the second through via electrode 345 may be formed on the tape 430, and an upper surface of the stack wafer 450 may be covered by the third adhesion layer 440.

In an example embodiment, the second through via electrode 345 may have a second diameter D2 in the horizontal direction less than the first diameter D1 of the first through via electrode 145, and thus may have a relatively high margin of error with respect to their positioning in layout of the circuit patterns or wirings.

Additionally, a second length L2 of the second through via electrode 345 may be less than the first length L1 of the first through via electrode 145, and a second thickness T2 of the second substrate 300 in the stack wafer 450 may be less than the first thickness T1 of the first substrate 100 in the base wafer 250.

However, in an example embodiment, a ratio (i.e., a first aspect ratio) of the first length L1 with respect to the first diameter D1 may be substantially equal to or greater than a second aspect ratio, that is, a ratio of the second length L2 with respect to the second diameter D2. Thus, even if the second through via electrode 345 has a relatively small diameter, a second trench for forming the second preliminary through via electrode may be well filled with the second conductive layer 330 with no void therein, and the characteristics of the second through via electrode 345 may not be deteriorated.

Figure 7:
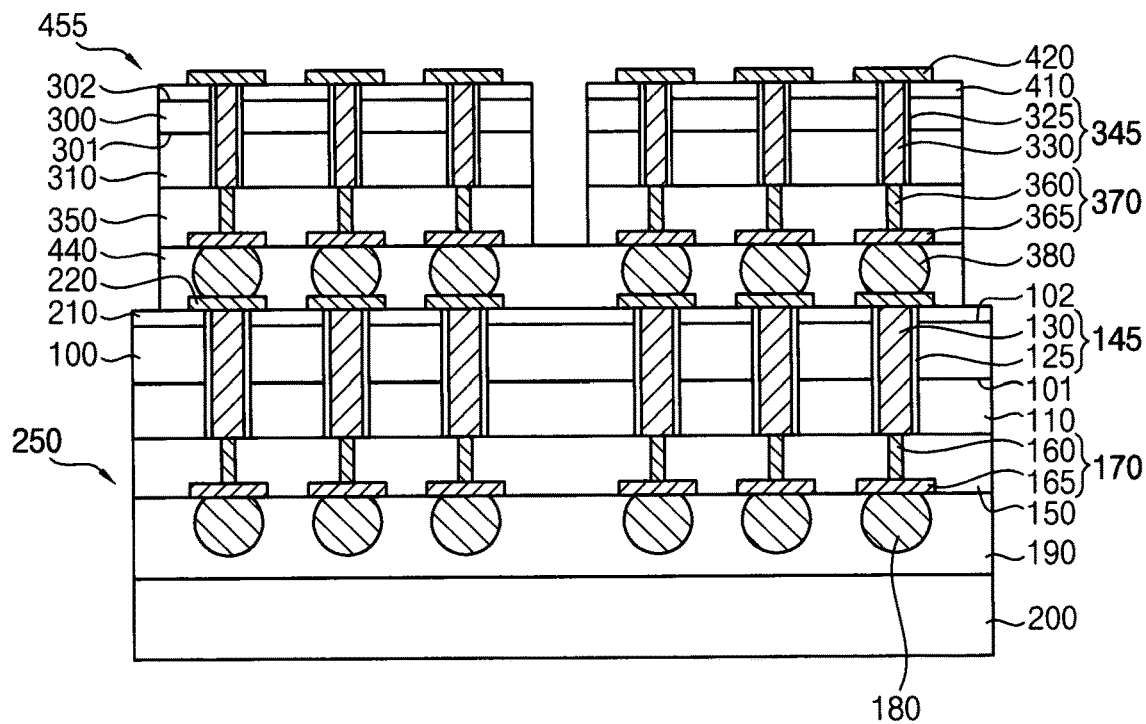

In an example embodiment, referring to FIG. 7, the stack wafer 450 may be divided into a plurality of semiconductor chips 455 by, e.g., a dicing process, and the plurality of first semiconductor chips 455 (two first semiconductor chips 455 in FIG. 7) may be mounted so that the second conductive bump 380 of each of the plurality of first semiconductor chips 455 may contact an upper surface of the first conductive pad 220 of the base wafer 250.

In an example embodiment, the plurality of first semiconductor chips 455 may be bonded onto the base wafer 250 by a thermal compression non-conductive paste (TCNCP) process. That is, the second conductive bump 380 of each of the plurality of first semiconductor chips 455 may be placed to contact the respective first conductive pad 220 of the base wafer 250 and pressed at an appropriate attachment temperature so that the second conductive bump 380 may be attached onto the first conductive pad 220. Additionally, the third adhesion layer 440 may be formed between the first semiconductor chips 455 and the base wafer 250 so as to assist in attaching the first semiconductor chips 455 and the base wafer 250 to each other.

When the first semiconductor chips 455 are mounted onto the base wafer 250, the tape 430 may be removed.

Figure 8:
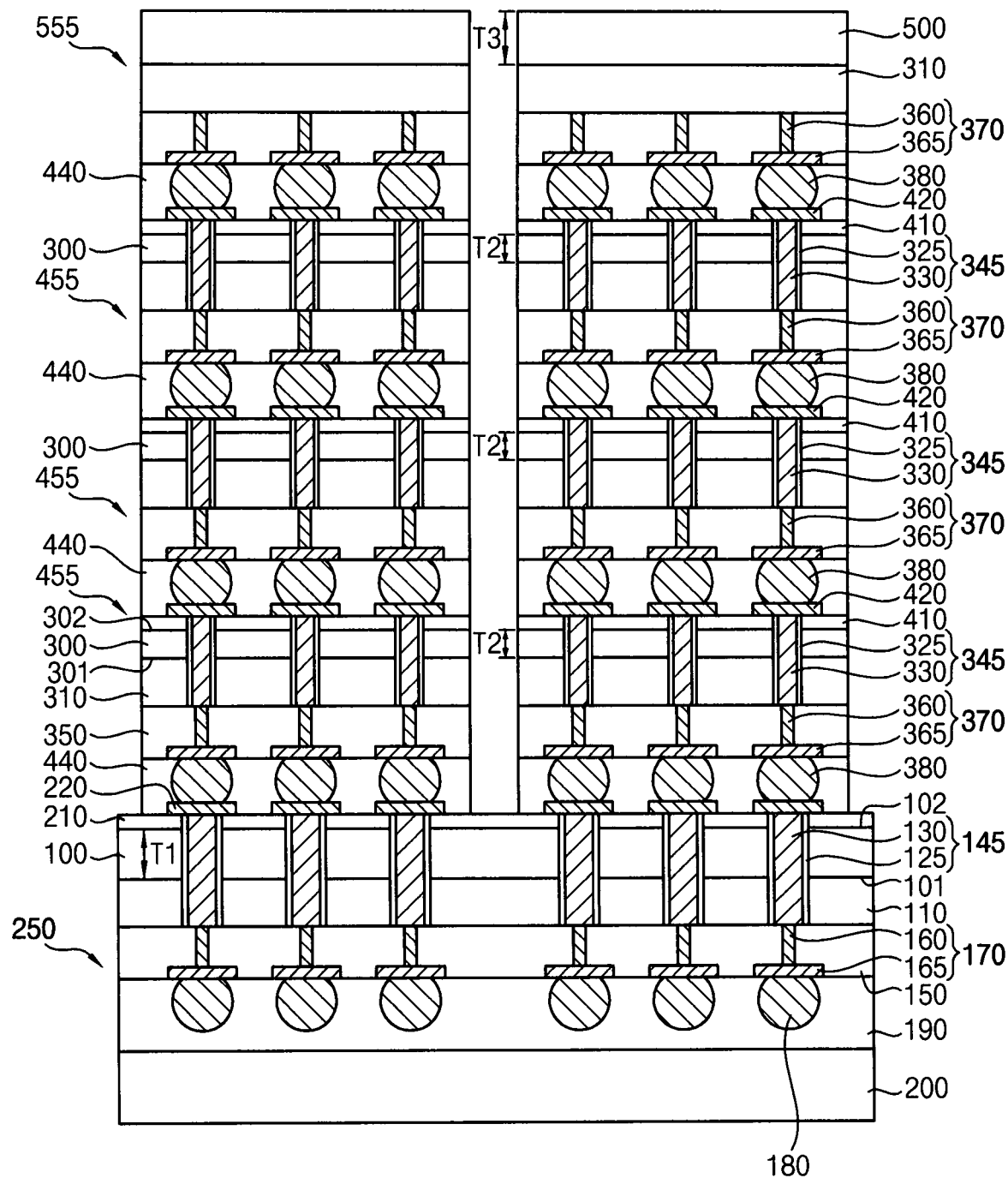

Referring to FIG. 8, additional first semiconductor chips 455 may be further stacked on the initial two first semiconductor chips 455, respectively, and a second semiconductor chip 555 may be stacked on an uppermost one of the first semiconductor chips 455.

The plurality of first semiconductor chips 455 including the uppermost one of the first semiconductor chips 455 and the second semiconductor chip 555 stacked in the vertical direction may be also bonded with one another by a TCNCP process.

FIG. 8 illustrates that the plurality of first semiconductor chips 455 are stacked at three levels, respectively, and the second semiconductor chip 555 is formed at one level on the base wafer 250, however, example embodiments may not be limited thereto. For example, the plurality of first semiconductor chips 455 may be stacked at seven levels, respectively, and the second semiconductor chip 555 may be formed at one level.

In an example embodiment, the second semiconductor chip 555 may not include any through via electrode provided therein unlike the first semiconductor chip 455, and a third thickness T3 in the vertical direction of a third substrate 500 in the second semiconductor chip 555 may be greater than the second thickness T2 in the vertical direction of each of the first semiconductor chips 455.

Figure 9:
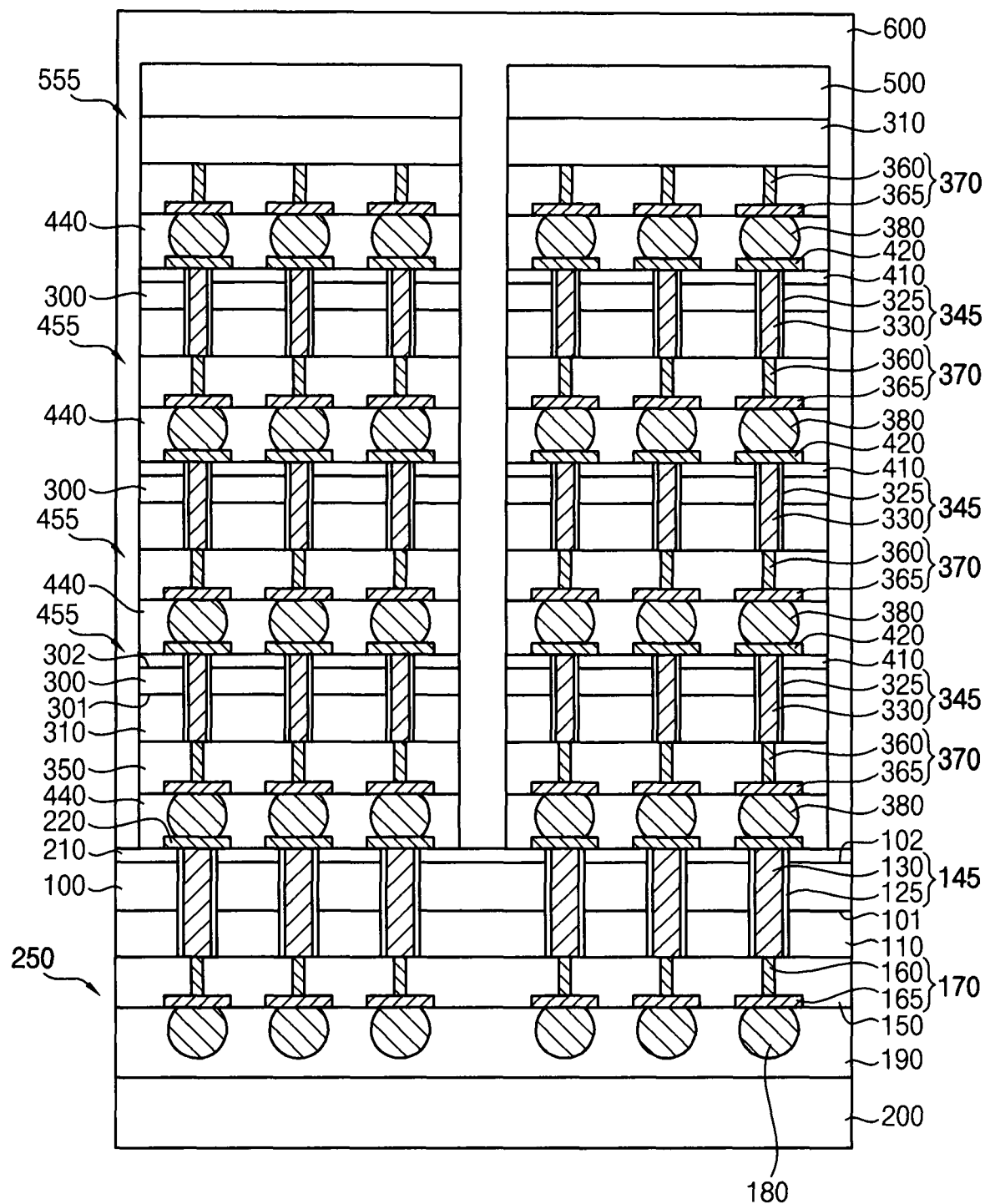

Referring to FIG. 9, a molding element 600 may be formed on the base wafer 250 to cover the first and second semiconductor chips 455 and 555.

Referring back to FIG. 1, from the embodiment shown in FIG. 9, the molding element 600 may be removed until an upper surface of the second semiconductor chip 555 may be exposed, and the first adhesion layer 190 and the first handling substrate 200 including the WSS under the base wafer 250 may be removed to form a chip on wafer (CoW) package.

Various electrical tests may be performed on the CoW package, and during the test, the CoW package may be damaged by, e.g., warpage. However, in the example embodiments, the first thickness T1 of the first substrate 100 in the base wafer 250 may be greater than the second thickness T2 of each of the plurality of first semiconductor chips 455 that may be stacked on the base wafer 250, and thus the damage of the CoW package due to the warpage may be reduced.

Additionally, the second diameter D2 of the second through via electrode 345 in each of the first semiconductor chips 455 may be less than the first diameter D1 of the first through via electrode 145 in the base wafer 250, and thus each of the first semiconductor chips 455 may have a high freedom in layout of the circuit patterns or wirings.

The second aspect ratio of the second through via electrode 345 may be equal to or less than the first aspect ratio of the first through via electrode 145, and thus, even if the second through via electrode 345 has a relatively small diameter, the characteristics thereof may not be deteriorated.

Further, the second thickness T2 of the second substrate 300 in each of the first semiconductor chips 455 may be less than the first thickness T1 of the first substrate 100 in the base wafer 250, and thus more first semiconductor chips 455 may be stacked on the base wafer 250, and the CoW package including the first semiconductor chips 455 may have high capacity and high performance.

Figure 10:
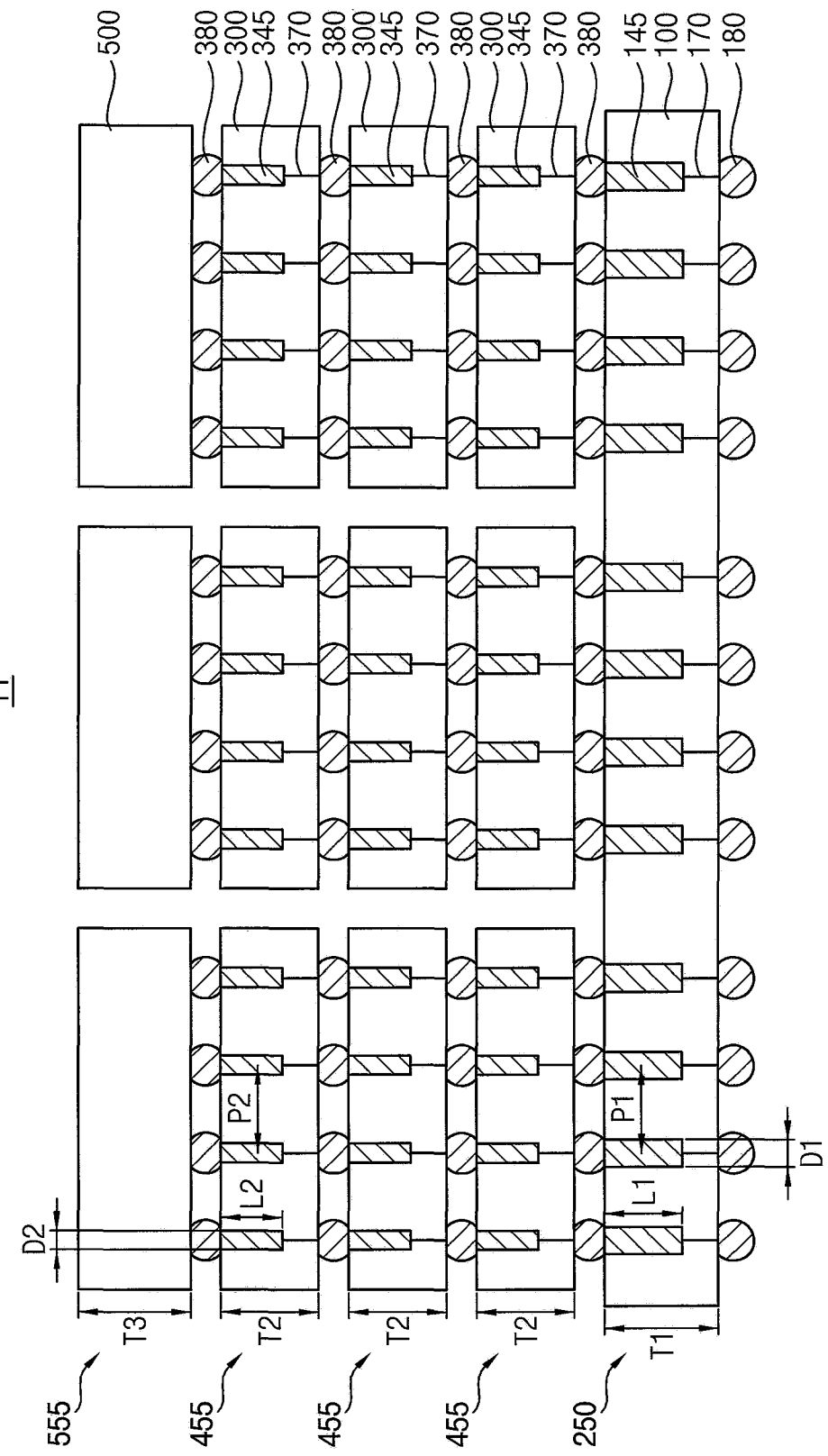
FIG. 10 is a cross-sectional view illustrating a semiconductor package where a pitch of through via electrodes of a semiconductor chip is substantially equal to a pitch of through via electrodes of a base wafer in accordance with an example embodiment.

FIG. 10 is a cross-sectional view illustrating a semiconductor package 11 where a pitch of through via electrodes of a semiconductor chip is substantially equal to a pitch of through via electrodes of a base wafer in accordance with an example embodiment.

Referring to FIG. 10, a plurality of first semiconductor chips 455 may be disposed in the horizontal direction to be spaced apart from each other on the base wafer 250, two more first semiconductor chips 455 may be stacked in the vertical direction on each of the first semiconductor chips 455, and the second semiconductor chip 555 may be stacked on an uppermost one of the first semiconductor chips 455.

However, the number of the first semiconductor chips 455 stacked in the vertical direction may not be limited thereto.

In example embodiments, the first thickness T1 of the base wafer 250 may be greater than the second thickness T2 of each of the first semiconductor chips 455. Additionally, the second diameter D2 and the second length L2 of the second through via electrode 345 may be less than the first diameter D1 and the first length L1, respectively, of the first through via electrode 145. However, the first aspect ratio of the first through via electrode 145 may be equal to or greater than the second aspect ratio of the second through via electrode 345.

A second pitch P2 between the second through via electrodes 345 may be substantially equal to a first pitch P1 of the first through via electrodes 145. That is, a distance between centers of the respective second through via electrodes 345 may be substantially equal to a distance between centers of the respective first through via electrodes 145.

Figure 11:
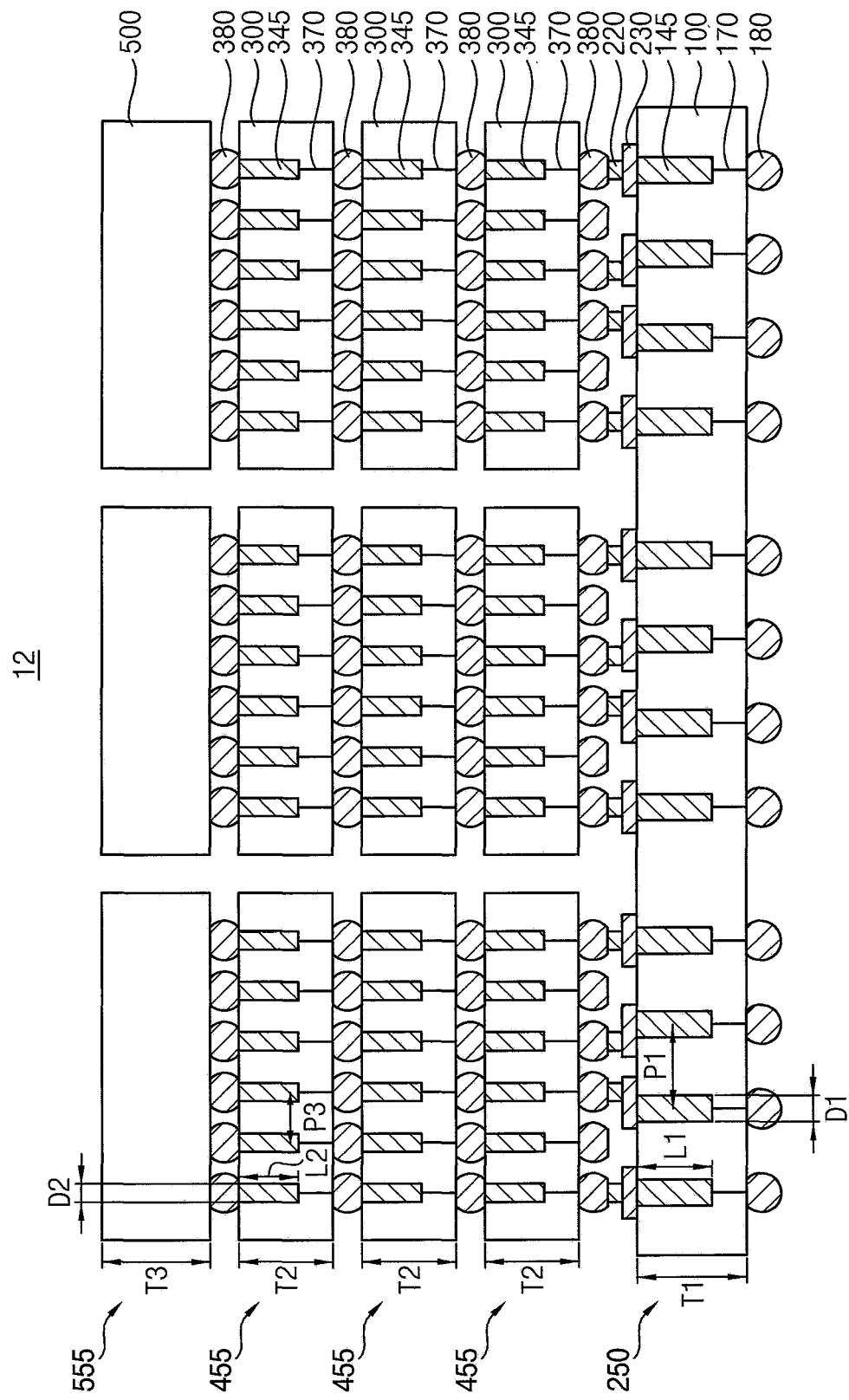
FIG. 11 is a cross-sectional view illustrating a semiconductor package where a pitch of through via electrodes of a semiconductor chip is different from a pitch of through via electrodes of a base wafer in accordance with an example embodiment.

FIG. 11 is a cross-sectional view illustrating a semiconductor package 12 where a pitch of through via electrodes of a semiconductor chip is different from a pitch of through via electrodes of a base wafer in accordance with an example embodiment.

Referring to FIG. 11, a third pitch P3 between the adjacent second through via electrodes 345 may be less than the first pitch P1 of the adjacent first through via electrodes 145.

Thus, more second through via electrodes 345 may be formed in the same area, and the integration degree of each of the first semiconductor chips 455 may be enhanced.

However, a redistribution layer 230 may be additionally formed between the base wafer 250 and the first conductive pad 220 so as to adjust the location of the first conductive pad 220, and thus the first conductive pad 220 may be efficiently connected to the second conductive bump 380 of the first semiconductor chip 455.

The redistribution layer 230 may include a metal, a metal nitride, a metal silicide, etc.

Figure 12:
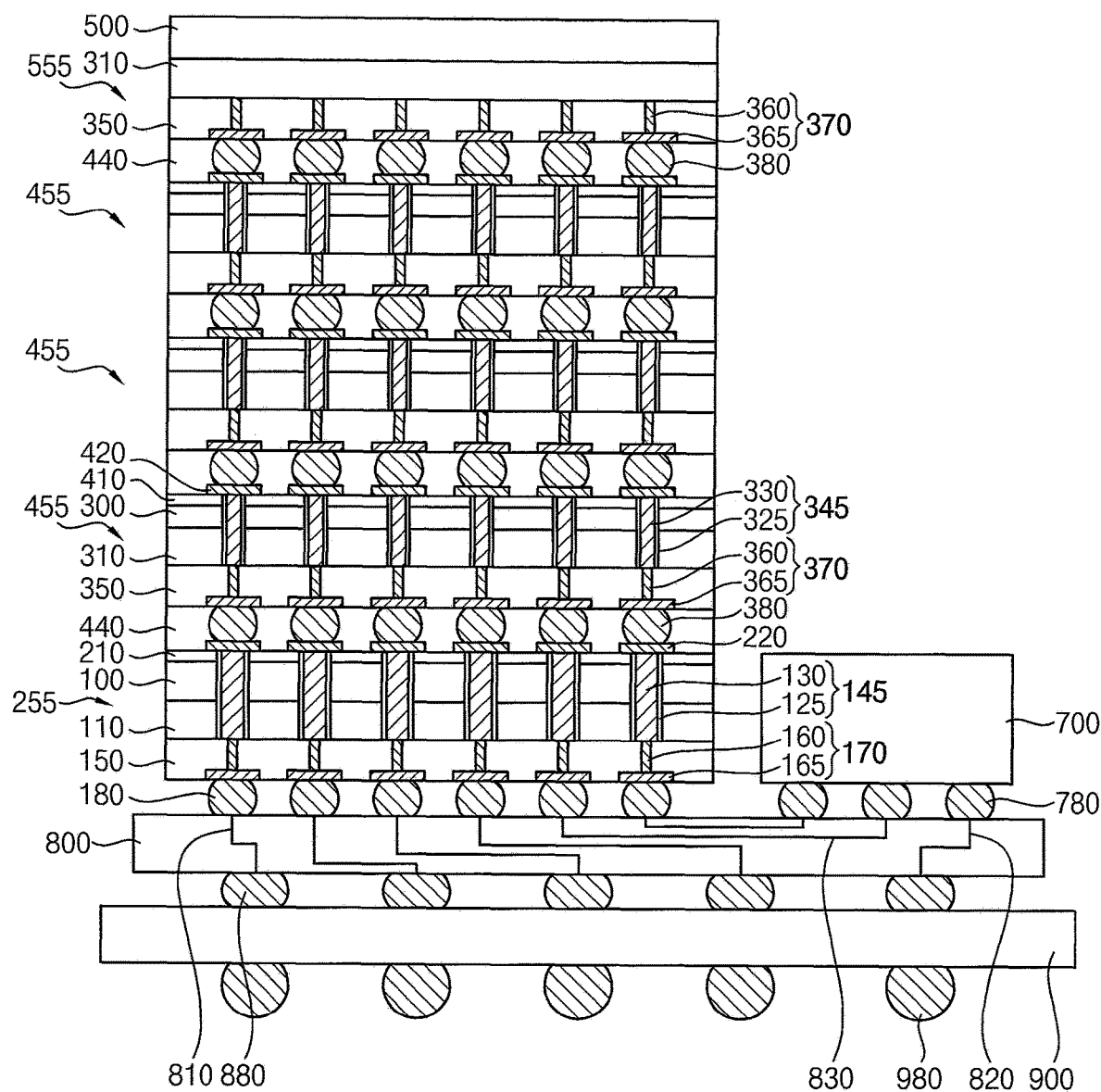
FIG. 12 is a semiconductor package in accordance with an example embodiment.

FIG. 12 is a semiconductor package 13 in accordance with an example embodiment.

This semiconductor package 13 may be a high bandwidth memory (HBM) package, and may include elements substantially the same as or similar to those of the semiconductor package 10 illustrated with reference to FIG. 1. Thus, detailed descriptions on the same elements are omitted herein.

Referring to FIG. 12, the semiconductor package may include a package substrate 900, an interposer 800, a base chip 255, the plurality of first semiconductor chips 455, and the second semiconductor chip 555. The semiconductor package 13 may further include a processor chip 700 spaced apart from the base chip 255 on the interposer 800.

In the figure, one base chip 255 and the plurality of first semiconductor chips 455 and the second semiconductor chip 455 sequentially stacked on the base chip 255 are shown, however, example embodiments may not be limited thereto. For example, the semiconductor package 13 may include four base chips 255 around one processor chip 700, and the plurality of first semiconductor chips 455 and the second semiconductor chip 555 on each of the base chips 255.

The package substrate 900 may include, for example, a printed circuit board (PCB). An outer connection terminal 980 may be formed beneath the package substrate 900, and thus the semiconductor package may be mounted on a module substrate or a main board through the outer connection terminal 980.

Third conductive bumps 880 may be formed between the package substrate 900 and the interposer 800, the first conductive bumps 180 may be formed between the interposer 800 and the base chip 255, and fourth conductive bumps 780 may be formed between the interposer 800 and the processor chip 700. Additionally, the second conductive bumps 380 may be formed between the base chip 255 and the first semiconductor chip 455, between the first semiconductor chips 455, and between the first semiconductor chip 455 and the second semiconductor chip 555.

Third, fourth, and fifth wirings 810, 820 and 830 may be formed in the interposer 800. The third wiring 810 may electrically connect ones of the first conductive bumps 180 to ones of the third conductive bumps 880, the fourth wiring 820 may electrically connect ones of the fourth conductive bumps 780 to ones of the third conductive bumps 880, and the fifth wiring 830 may electrically connect ones of the first conductive bumps 180 to ones of the fourth conductive bumps 780.

The base chip 255 may be formed by cutting the base wafer 250 through a dicing process. Thus, the base chip 255 may include the first substrate 100, the first through via electrode 145, the first wiring structure 170, the first conductive pad 220 and the first passivation layer 210.

In an example embodiment, the base chip 255 may include a logic chip or a controller chip. Alternatively, the base chip 255 may include a memory chip, e.g., a DRAM chip.

The plurality of first semiconductor chips 455 may be stacked at a plurality of levels on the base chip 255. The second semiconductor chip 555 may be stacked on an uppermost one of the plurality of first semiconductor chips 455.

The third adhesion layer 440 may be formed between the first semiconductor chip 455 and the base chip 255, the first semiconductor chips 455, and the first semiconductor chip 455 and the second semiconductor chip 555.

In an example embodiment, the processor chip 700 may include a graphic processing unit (GPU) chip or a central processing unit (CPU) chip.

The semiconductor package 13 in FIG. 12 may have high capacity and high performance like the semiconductor package 10 illustrated with reference to FIG. 1.

A semiconductor package in accordance with example embodiments may have high capacity and high performance, and further an enhance reliability. Further, a semiconductor package in accordance with example embodiments may have a high freedom in layout of circuit patterns or wirings.

The foregoing is illustrative of example embodiments and is not to be construed as limiting thereof. Although a few example embodiments have been described, those skilled in the art will readily appreciate that many variations and modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor package comprising:
   a base wafer including:
      a first substrate; and
      at least one first through via electrode extending through the first substrate; and
   a first semiconductor chip provided on the base wafer, the first semiconductor chip including:
      a second substrate; and
      at least one second through via electrode extending through the second substrate, wherein the at least one second through via electrode is provided on the at least one first through via electrode to be electrically connected to the at least one first through via electrode, wherein a first diameter of the at least one first through via electrode in a first direction is greater than a second diameter of the at least one second through via electrode in the first direction, wherein a first aspect ratio of the at least one first through via electrode is substantially equal to or greater than a second aspect ratio of the at least one second through via electrode, wherein the first aspect ratio is a ratio of a first length of the at least one first through via electrode in a second direction to the first diameter of the at least one first through via electrode in the first direction, the second direction being substantially perpendicular to the first direction, and wherein the second aspect ratio is a ratio of a second length of the at least one second through via electrode in the second direction to the second diameter of the at least one second through via electrode in the first direction.

2. The semiconductor package of claim 1, wherein a first thickness of the first substrate in the second direction is greater than a second thickness of the second substrate in the second direction.

3. The semiconductor package of claim 1, wherein the first length of the at least one first through via electrode in the second direction is greater than the second length of the at least one second through via electrode in the second direction.

4. The semiconductor package of claim 1, wherein the base wafer further includes at least one first via directly connected to the at least one first through via electrode, and
wherein the first semiconductor chip further includes at least one second via directly connected to the at least one second through via electrode.

5. A semiconductor package comprising:
a package substrate;
an interposer provided on the package substrate;
a base chip including:
a first substrate; and
at least one first through via electrode extending through the first substrate;
a first semiconductor chip provided on the base chip, the first semiconductor chip including:
a second substrate; and
at least one second through via electrode extending through the second substrate; and
a processor chip provided on the interposer and spaced apart in a first direction from the base chip,
wherein the at least one second through via electrode is provided on the at least one first through via electrode to be electrically connected to the at least one through via electrode,
wherein a first diameter of the at least one first through via electrode in the first direction is greater than a second diameter of the at least one second through via electrode in the first direction,
wherein a first aspect ratio of the at least one first through via electrode is substantially equal to or greater than a second aspect ratio of the at least one second through via electrode,
wherein the first aspect ratio is a ratio of a first length of the at least one first through via electrode in a second direction to the first diameter of the at least one first through via electrode in the first direction, the second direction being substantially perpendicular to the first direction, and
wherein the second aspect ratio is a ratio of a second length of the at least one second through via electrode in the second direction to the second diameter of the at least one second through via electrode in the first direction.

6. The semiconductor package of claim 5, wherein the base chip includes a graphics processing unit (GPU) chip or a central processing unit (CPU) chip.

7. The semiconductor package of claim 5, wherein the base chip includes a logic device or a controller, and
wherein the first semiconductor chip includes a memory device.

8. The semiconductor package of claim 5, wherein the interposer includes:
a first wiring electrically connecting the base chip and the package substrate to each other;
a second wiring electrically connecting the processor chip and the package substrate to each other; and
a third wiring electrically connecting the base chip and the processor chip to each other.

9. The semiconductor package of claim 5, wherein a first thickness of the first substrate in the second direction substantially perpendicular to the first direction is greater than a second thickness of the second substrate in the second direction.

10. The semiconductor package of claim 5, wherein the first length of the at least one first through via electrode in the second direction substantially perpendicular to the first direction is greater than the second length of the at least one second through via electrode in the second direction.

11. The semiconductor package of claim 5, wherein a first pitch of the at least one first through via electrode is substantially equal to a second pitch of the at least one second through via electrode.

12. The semiconductor package of claim 5, further comprising a plurality of first semiconductor chips including the first semiconductor chip, the plurality of first semiconductor chips being stacked in the second direction.

13. The semiconductor package of claim 12, further comprising a second semiconductor chip provided on an uppermost first semiconductor chip of the plurality of first semiconductor chips in the second direction, the second semiconductor chip including a third substrate.

14. The semiconductor package of claim 13, wherein a third thickness of the third substrate in the second direction is greater than a second thickness of the second substrate in the second direction.

15. The semiconductor package of claim 5, further comprising a plurality of first semiconductor chips including the first semiconductor chip, the plurality of first semiconductor chips being spaced apart from one another in the first direction on the base chip.

16. A semiconductor package comprising:
a package substrate;
an interposer provided on the package substrate;
a base chip including:
a first substrate; and
at least one first through via electrode extending through the first substrate;
a first semiconductor chip provided on the base chip, the first semiconductor chip including:
a second substrate; and
at least one second through via electrode extending through the second substrate; and a processor chip provided on the interposer and spaced apart in a first direction from the base chip, wherein a first diameter of the at least one first through via electrode in the first direction is different from a second diameter of the at least one second through via electrode in the first direction, wherein a first aspect ratio of the first through via electrode is equal to or greater than a second aspect ratio of the second through via electrode, wherein the first aspect ratio is a ratio of a first length of the at least one first through via electrode in a second direction to the first diameter of the at least one first through via electrode in the first direction, the second direction being substantially perpendicular to the first direction, and wherein the second aspect ratio is a ratio of a second length of the at least one second through via electrode in the second direction to the second diameter of the at least one second through via electrode in the first direction.

17. The semiconductor package of claim 16, wherein a first thickness of the first substrate in the second direction is greater than a second thickness of the second substrate in the second direction.

18. The semiconductor package of claim 16, wherein the first length of the at least one of first through via electrode in the second direction is greater than the second length of the at least one second through via electrode in the second direction.

19. The semiconductor package of claim 16, wherein a first pitch of the at least one first through via electrode is substantially equal to a second pitch of the at least one second through via electrode.

* * * * *